United States Patent
Lee et al.

(10) Patent No.: US 7,107,467 B2
(45) Date of Patent: Sep. 12, 2006

(54) SEMICONDUCTOR MEMORY DEVICE HAVING A CIRCUIT FOR REMOVING NOISE FROM A POWER LINE OF THE MEMORY DEVICE USING A PLURALITY OF DECOUPLING CAPACITORS

(75) Inventors: Hi-Choon Lee, Yongin (KR); Kyung-Ho Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 465 days.

(21) Appl. No.: 10/414,218

(22) Filed: Apr. 16, 2003

(65) Prior Publication Data

US 2003/0202395 A1  Oct. 30, 2003

(30) Foreign Application Priority Data

Apr. 19, 2002  (KR) ...................... 10-2002-0021682

(51) Int. Cl.
   *G06F 1/26*  (2006.01)
(52) U.S. Cl. ....................................... 713/300; 365/206
(58) Field of Classification Search ................ 713/300; 365/230.06, 206; 257/296; 307/129; 327/380, 327/525, 594, 595
   See application file for complete search history.

(56) References Cited

U.S. PATENT DOCUMENTS 5,237,536 A * 8/1993 Ohtsuki ................. 365/230.06
5,394,294 A   2/1995 Mei et al.
5,506,457 A * 4/1996 Krauter et al. ............... 307/129
5,770,969 A * 6/1998 Walls et al. ................. 327/594
5,789,964 A * 8/1998 Voldman ..................... 327/380
5,801,412 A * 9/1998 Tobita ......................... 257/296
6,084,464 A * 7/2000 Lin ............................. 327/525

FOREIGN PATENT DOCUMENTS

KR    1998-063507    10/1998

\* cited by examiner

*Primary Examiner*—Chun Cao
*Assistant Examiner*—Hari Patel
(74) *Attorney, Agent, or Firm*—Volentine Francos & Whitt, PLLC

(57) ABSTRACT

The power noise removing circuit includes a decoupling capacitor group, a repair circuit unit, a monitoring pad, and a testing unit. The decoupling capacitor group includes a plurality of decoupling capacitors that store noise flowing into an internal power line. The decoupling capacitors are DRAM cell type capacitors. The repair circuit unit controls a connection of each of the decoupling capacitors in the decoupling capacitor group to an external input power line. The monitoring pad measures the amount of current leaking from the decoupling capacitor group. The testing unit controls a connection of the decoupling capacitor group to the monitoring pad. If the decoupling capacitor group is tested as being defective, the defective decoupling capacitor group is made inoperative by disconnection from the external input power line.

20 Claims, 6 Drawing Sheets

SEMICONDUCTOR MEMORY DEVICE HAVING A CIRCUIT FOR REMOVING NOISE FROM A POWER LINE OF THE MEMORY DEVICE USING A PLURALITY OF DECOUPLING CAPACITORS

BACKGROUND OF THE INVENTION

1. Field of the Invention

The present invention relates to semiconductor devices, and more particularly, to a circuit for removing noise from the internal power line of a semiconductor device in order to minimize fluctuations in an internal voltage of the semiconductor device.

2. Description of the Related Art

Together with advancements in semiconductor memory design and processing techniques, semiconductor integrated circuits capable of operating at low operating voltages have been developed. For example, in dynamic random access memories (DRAMs) contained in portable electronic or/and communication equipment, the operating voltage has recently been lowered to 1.0V or less.

Each memory cell of a DRAM includes an access transistor which performs a switching function, and a capacitor (hereinafter, referred to as a cell capacitor) connected to the access transistor. Reading and writing of the DRAM is carried by selectively storing charges in the cell capacitors. Data is represented as 1 or 0 depending on the amount of charges stored in the cell capacitor. If external influences cause the amount of charges stored in the cell capacitor to vary, the data of the memory cell can be misread, resulting in a DRAM malfunction. Once source of malfunctions is the introduction of noise into the internal power line of the DRAM to such an extent that a resultant fluctuation in the power supply voltage level adversely effects the amount of charges stored in the cell capacitors.

In an effort to remove external noises, the internal power line may be equipped with decoupling capacitors. Conventional decoupling capacitors are MOS transistor type capacitors whose gates are connected to the internal power line, and whose sources and drains are coupled to a power supply ground.

FIG. 1 is a block diagram of the layout of a semiconductor memory device or chip having a conventional power noise removing circuit. The chip includes memory cells formed in each of memory cell array areas 110a, 110b, 110c, and 110d, an internal power generator 120 installed at a central region of the chip, an internal power line 130, and a plurality of decoupling capacitors MCi (where i is a positive integer) connected to the internal power line 130.

The surface area of the chip is divided into four the memory cell array areas 110a, 110b, 110c, and 110d, and each of these memory cells areas contain a plurality of sub arrays. Peripheral circuits are installed between the memory cell array areas.

The internal power line 130 has a mesh shape and is installed to supply an internal power voltage generated by the internal power generator 120 to each of the sub arrays. To reduce noise, the internal power line 130 is connected to the gate electrodes of the decoupling capacitors MCi. In FIG. 1, reference numeral 140 denotes an area where the decoupling capacitors MCi are arranged, and reference numeral 140a denotes a magnified portion of the area where the decoupling capacitors MCi are arranged.

As mentioned above, and as shown in FIG. 1, the decoupling capacitors MCi are MOS transistor type capacitors whose gates are connected to the internal power line 130 and whose sources and drains are coupled to a ground power supply.

If external noise flows into the internal power line 130, charges corresponding to the noise are stored in the MOS decoupling capacitors MCi and discharged to ground. Thus, fluctuation of the internal supply voltage is reduced.

Decoupling capacitors in the form of MOS transistors are convenient for designers to use. However, since each MOS decoupling capacitor has a low electrostatic capacity, many capacitors are needed to obtain an overall electrostatic capacity which is sufficient to remove power noise. Hence, the decoupling capacitors constitute overhead which increases the size of the chip.

In addition, current leakage through an MOS decoupling capacitor can occur if the capacitor contains a defective insulating oxide film, resulting in DRAM malfunctions. Conventional power noise removing circuits cannot completely isolate such defective decoupling capacitors from the power lines.

SUMMARY OF THE INVENTION

A power line noise removing circuit is described herein which uses high-capacity decoupling capacitors that do not occupy a large area, and which operationally removes defective decoupling capacitors which might cause DRAM malfunctions.

Also, a semiconductor memory device is described herein which is equipped with the power noise removing circuit.

According to an aspect of the present invention, there is provided a circuit for removing noise from an internal power line of a semiconductor memory device to supply power to a memory cell array, the circuit including a plurality of decoupling capacitor groups and a repair circuit unit. The plurality of decoupling capacitor groups remove noise from the internal power line and each includes at least one decoupling capacitor of a DRAM cell capacitor type. The repair circuit unit controls a connection of each of the decoupling capacitor groups to an external input power line. The repair circuit unit disconnects decoupling capacitor groups containing defective decoupling capacitors from the external input power line.

According to another aspect of the present invention, there is provided a circuit for removing noise from an internal power line of a semiconductor memory device to supply power to a memory cell array, the circuit including a decoupling capacitor group, a repair circuit unit, a monitoring pad, and a testing unit. The decoupling capacitor group includes a plurality of decoupling capacitors that store noise flowing into the internal power line. The repair circuit unit controls a connection of each of the decoupling capacitors in the decoupling capacitor group to an external input power line. The monitoring pad measures the amount of current leaking from the decoupling capacitor group. The testing unit controls a connection of the decoupling capacitor group to the monitoring pad.

According to still another aspect of the present invention, there is provided a semiconductor memory device including a memory cell array including a plurality of sub array blocks, an internal power line supplying power to the sub array blocks, the power voltage line disposed in a mesh shape, and a power noise removing circuit removing noise introduced into the power voltage line. The power noise removing circuit includes a plurality of decoupling capacitor groups and a repair circuit unit. The decoupling capacitor groups remove noise from the internal power line and each include at least one decoupling capacitor of a DRAM cell capacitor type. The repair circuit unit controls a connection of each of the decoupling capacitor groups to an external input power line. The repair circuit unit disconnects decoupling capacitor groups containing defective decoupling capacitors from the external input power line.

According to still another aspect of the present invention, there is also provided a semiconductor memory device including: a memory cell array including a plurality of sub array blocks, an internal power line supplying power to the sub array blocks, the power voltage line disposed in a mesh shape, and a power noise removing circuit removing noise introduced into the power voltage line. The power noise removing circuit includes a decoupling capacitor group including a plurality of decoupling capacitors that store noise flowing into the internal power line, a repair circuit unit controlling a connection of each of the decoupling capacitors in the decoupling capacitor group to an external input power line, a monitoring pad measuring the amount of current leaking from the decoupling capacitor group, and a testing unit controlling a connection of the decoupling capacitor group to the monitoring pad.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF THE PREFERRED EMBODIMENTS

As described above, since the MOS transistor type decoupling capacitor has a small electrostatic capacity, the conventional technique is to couple a large number of such capacitors to the internal power line in an effort to reduce noise induced fluctuations. This adversely increases the size of the chip. To overcome this problem, according to one aspect of the present invention, decoupling capacitors are constituted by cell capacitors of the DRAM cell. DRAM cell capacitors occupy a significantly smaller area in the chip and exhibit a higher capacitance than MOS transistor type capacitors.

According to another aspect of the present invention, the decoupling capacitors are partitioned into at least two groups, and individual decoupling capacitor groups are tested to determine if they are defective, for example, to determine if there current leakage caused by a defective dielectric layer. Any defective decoupling capacitor group is then isolated from the others.

The present invention will now be described more fully with reference to the accompanying drawings, in which preferred but non-limiting embodiments of the invention are shown.

Figure 1:
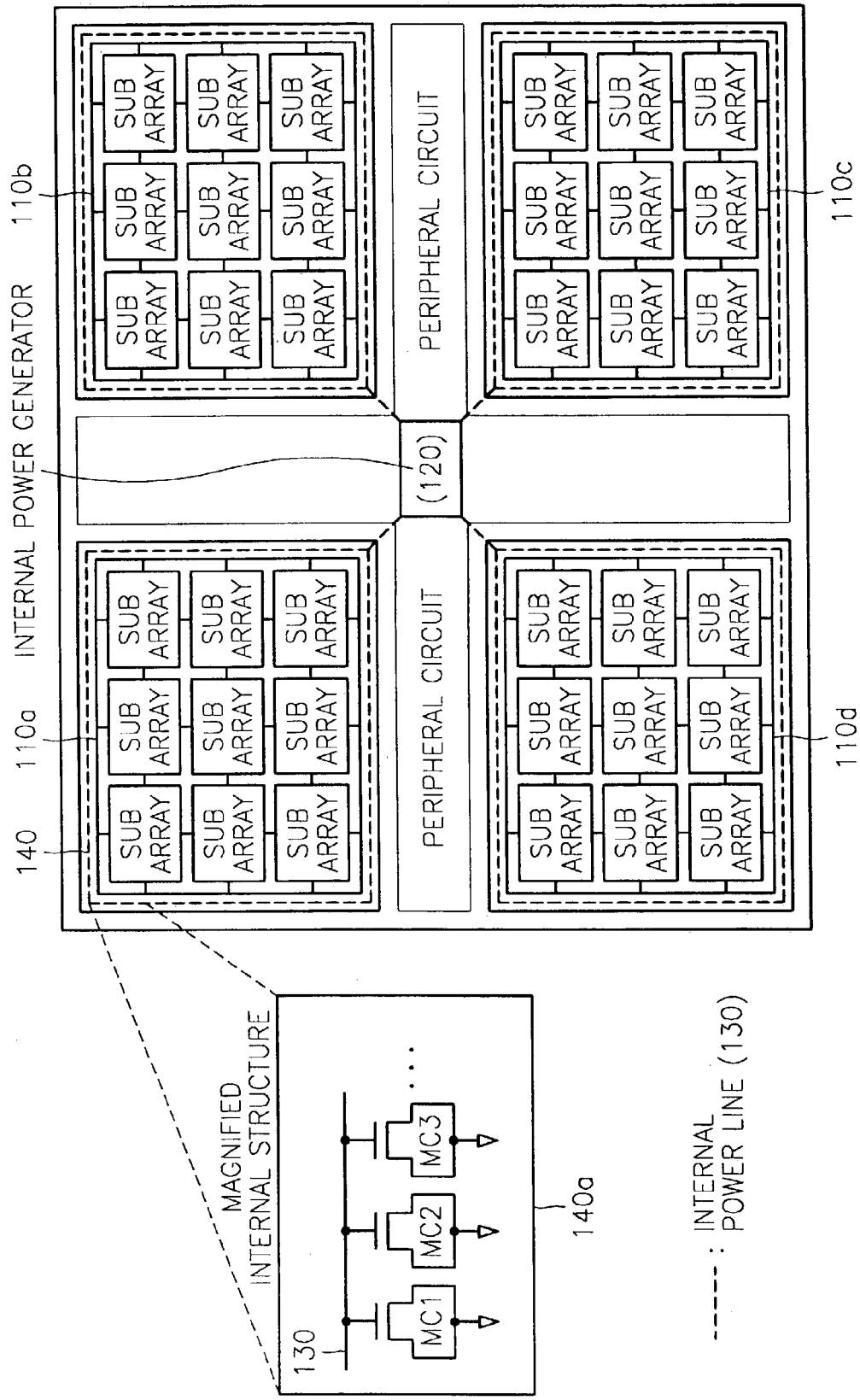
FIG. 1 is a block diagram of the layout of a semiconductor memory device having a conventional circuit for removing noise introduced into a power line.
Figure 2:
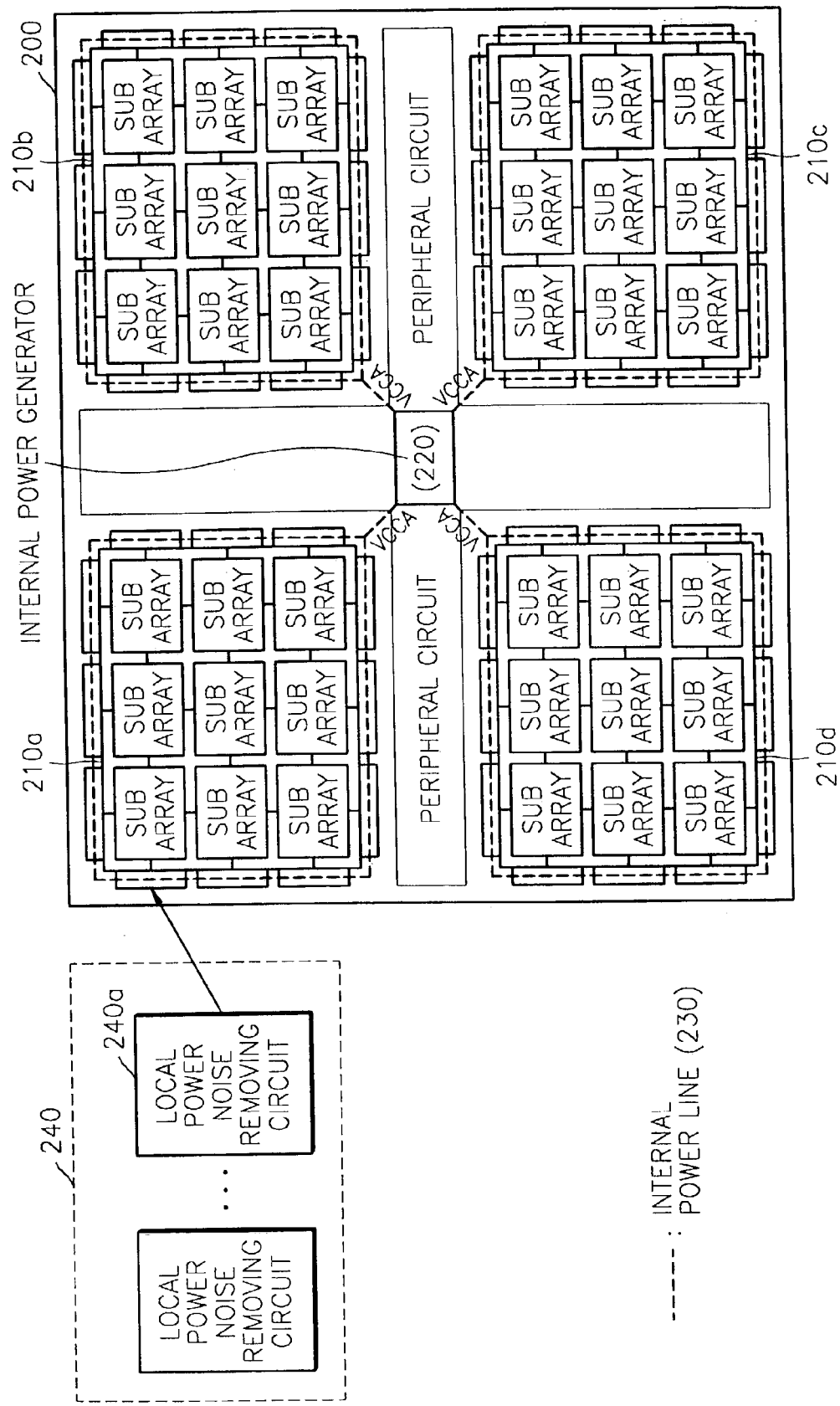
FIG. 2 is a block diagram of the layout of a semiconductor memory device having a circuit for removing noise introduced into a power line, according to an embodiment of the present invention.

FIG. 2 is a layout of a semiconductor memory device 200 having a power noise removing circuit according to an embodiment of the present invention. The semiconductor memory device 200 includes memory cell arrays 210a, 210b, 210c, and 210d, an internal power generator 220, an internal power line 230, and a power line noise removing circuit 240. Each of the memory cell arrays 210a, 210b, 210c, and 210d includes a plurality of sub arrays as shown. Peripheral circuits are interposed between the memory cell arrays 210a, 210b, 210c, and 210d.

The internal power generator 220 receives an external power voltage and generates an internal power voltage VCCA. The internal power line 230 has a mesh shape and is wired to supply the internal power voltage VCCA to the sub arrays of memory cell arrays 210a, 210b, 210c, and 210d.

The power noise removing circuit 240 removes noise introduced into the internal power line 230 and includes a plurality of local power noise removing circuits 240a.

As will be explained in more detail below, the power noise removing circuit 240 of the embodiment includes a plurality of decoupling capacitor groups, a repair circuit unit for controlling the connection of each of the decoupling capacitor groups to an external input power line, a monitoring pad for measuring leakage current of the decoupling capacitor groups, and a testing unit for controlling the connection of each of the decoupling capacitor groups to the monitoring pad.

For convenience of explanation, each of the local power noise removing circuits 240a denotes a combination of one decoupling capacitor group, part of a repair circuit unit for controlling the connection of the decoupling capacitor group to an external input power line, and part of a testing unit for controlling whether to connect the decoupling capacitor group to a monitoring pad. Hereinafter, part of a repair circuit unit is referred to as a local repair circuit unit, and part of a testing unit is referred to as a local testing unit. Accordingly, the power noise removing circuit 240 includes a plurality of the local power noise removing circuits 240a.

Figure 3:
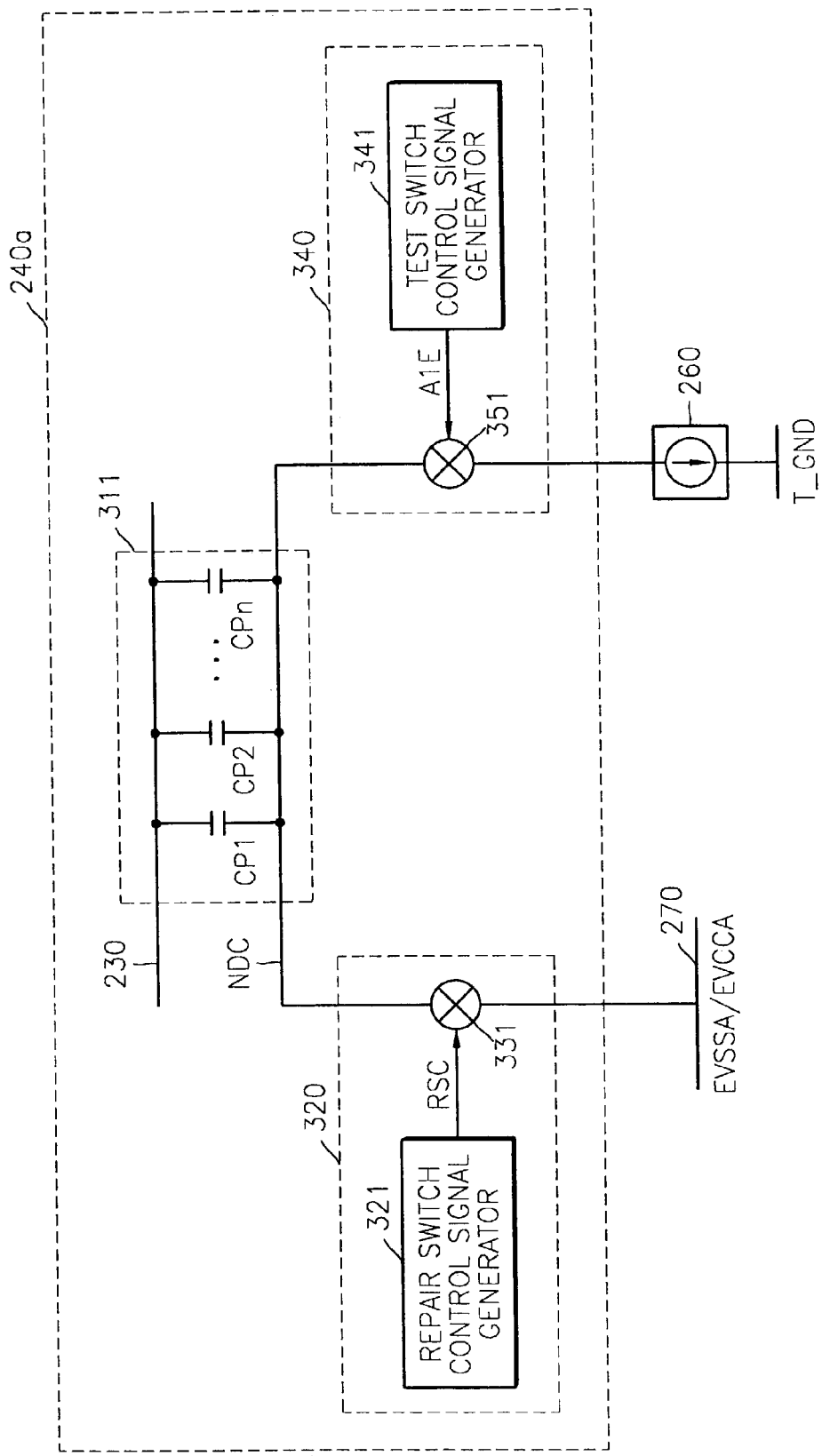
FIG. 3 is a circuit diagram of an embodiment of the local power noise removing circuit of FIG. 2.

FIG. 3 is a circuit diagram showing the detailed structure of the local power noise removing circuit 240a, which includes a decoupling capacitor group 311, a local repair circuit unit 320, and a local testing unit 340.

The decoupling capacitor group 311 includes a plurality of decoupling capacitors CPi (where i is a positive integer) connected between an internal power line 230 and a storage node NDC. One end of each of the decoupling capacitors CPi is coupled to the internal power line 230, while the other end thereof is coupled to the storage node NDC. The decoupling capacitors CPi are DRAM cell capacitors. As described above, the DRAM cell capacitors are capacitors of the type used to constitute a DRAM cell. Since the structure of each of DRAM cell capacitors and their general method of implementation are well known, they are not described here in detail.

The local repair circuit unit 320 controls a connection of each of the capacitors of the decoupling capacitor group 311 to an external input power line 270. The external input power line 270 is a power line for supplying an external power supply voltage EVCCA or an external ground voltage EVSSA. The local repair circuit unit 320 includes a repair switch 331, which is installed between the storage node NDC and the external input power line 270, and a repair switch control signal generator 321 for generating a repair switch control signal RSC used to switch on or off the repair switch 331.

If the repair switch 331 is turned on (closed), the storage node NDC is coupled to the external input power line 270. At this time, the decoupling capacitor group 311 properly operates between the internal power line 230 and the external input power line 270 and stores noise entering from the internal power line 230 to prevent fluctuations in the level of the internal power voltage. On the other hand, if the repair switch 331 is turned off (open), the storage node NDC is not coupled to the external input power line 270. Accordingly, the decoupling capacitor group 311 is separated from the external input power line 270 and thus cannot properly store noise entering from the internal power line 230.

The local testing unit 340 controls a connection of the decoupling capacitor 311 to a monitoring pad 260 for measuring a leakage current. The local testing unit 340 includes a test switch 351, which is interposed between the storage node NDC and the monitoring pad 260, and a test switch control signal generator 341 for generating a test switch control signal A1E used to switch on or off the test switch 351.

If the test switch 351 is turned on, the storage node NDC is coupled to a test ground T_GND via the monitoring pad 260. If the decoupling capacitor group 311 includes a defective capacitor, current leaks from the internal power line 230 to the test ground T_GND. The leakage current can be detected by the monitoring pad 260. If the leakage current represented on the monitoring pad 260 has a value of a predetermined regulation value or greater, it is determined that the decoupling capacitor group 311 is defective. Preferably, the storage node NDC is separated from the external input power line 270 while the decoupling capacitor group 311 is being tested.

If it is determined that the decoupling capacitor group 311 is defective, the decoupling capacitor group 311 is disconnected from the external input power line 270 by the local repair circuit unit 320.

Figure 4:
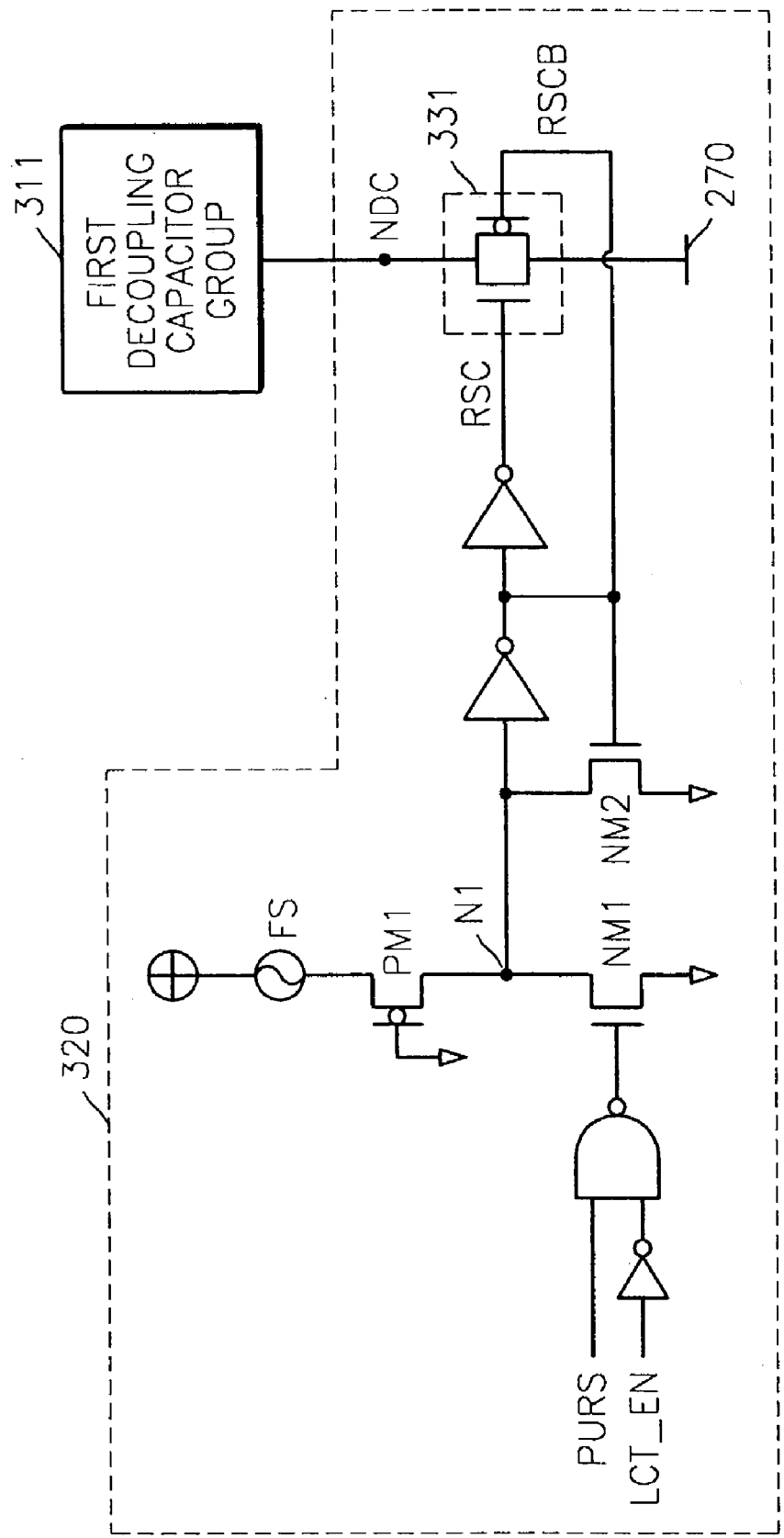
FIG. 4 is a circuit diagram of an embodiment of the local repair circuit unit of FIG. 3.

FIG. 4 is a circuit diagram showing an embodiment of the local repair circuit unit 320 of FIG. 3. The local repair circuit unit 320 includes a repair switch 331, a master fuse FS, NMOS transistors NM1 and NM2, a PMOS transistor PM1, inverters, and a NAND gate. The repair switch 331 is turned on when the repair switch control signal RSC has a predetermined first level (high level). The master fuse FS can be cut using a laser or electricity. The remaining portion of the local repair circuit unit 320 excluding the repair switch 331 corresponds to the repair switch control signal generator 321 of FIG. 3.

A power up signal PURS and a test enable signal LCT_EN are received by the local repair circuit unit 320. The power up signal PURS has a low level when power is applied to a semiconductor memory device. Then, the low level of the power up signal PURS changes into a high level if the level of the applied power reaches a predetermined level or greater. The test enable signal LCT_EN is generated by a testing unit 400 of FIG. 5 and is enabled when the test enable signal LCT_EN enters into a mode for testing whether a decoupling capacitor group is defective.

For convenience of explanation, a decoupling capacitor group controlled by the local repair circuit unit 320 is referred to as the first decoupling capacitor group 311. If the first decoupling capacitor group 311 is tested as defective, the master fuse FS is cut to isolate the first decoupling capacitor group 311 from the external input power line 270.

A description will now be given of the case where the power up signal PURS and the test enable signal LCT_EN are input to the local repair circuit unit 320 when the master fuse FS is cut. When the master fuse FS is cut and a low level of a power up signal PURS is applied to the local repair circuit unit 320 at the initial stage when power is applied, a first NMOS transistor NM1 is turned on. At this time, because the master fuse FS is cut, a first node N1 has a low level. Accordingly, the repair switch control signal RSC has a low level, and its inverted signal RSCB has a high level.

Hence, the repair switch 331 is turned off to isolate the first decoupling capacitor group 311 from the external input power line 270.

In other words, because a repair switch control signal RSC used to turn off the repair switch 331 is generated in response to a cutting operation of the master fuse FS, the first decoupling capacitor group 311 is isolated from the external input power line 270.

A description will now be given of the case where the power up signal PURS and the test enable signal LCT_EN are applied to the local repair circuit unit 320 when the master fuse FS is not cut off.

In the case that the test enable signal LCT_EN has a low level, that is, is in an inert state, when a power up signal PURS having a low level is applied at the initial stage when power is applied, the first NMOS transistor NM1 is turned on, and the first node N1 has a low level. If the level of the power up signal PURS changes into a high level, the first NMOS transistor NM1 is turned off, and the low level of the first node N1 changes into a high level. Consequently, the repair switch control signal RSC has a high level, and the repair switch 331 is turned on in response to the high level of the repair switch control signal RSC so that the first decoupling capacitor group 311 is connected to the external input power line 270.

If the test enable signal LCT_EN is activated to have a high level, the gate of the first NMOS transistor NM1 has a high level regardless of the level of the power up signal PURS, and accordingly, the first NMOS transistor NM1 is turned on. At this time, the first node N1 has a low level, because a PMOS transistor PM1 is turned on and the driving strength of the first NMOS transistor NM1 is greater than the PMOS transistor PM1. Accordingly, the repair switch control signal RSC has a low level, and the repair switch 331 is turned off. Thus, the first decoupling capacitor group 311 is isolated from the external input power line 270.

In other words, a repair switch control signal RSC used to turn off the repair switch 331 is generated in response to the activation of the test enable signal LCT_EN. Consequently, the first decoupling capacitor group 311 is isolated from the external input power line 270.

In order to test the first decoupling capacitor group 311, the test enable signal LCT_EN is activated to a high level so that the first decoupling capacitor group 311 is temporarily isolated from the external input power line 270. At this time, the first decoupling capacitor group 311 is connected to the monitoring pad 260.

If it is tested that the first decoupling capacitor group 311 is defective, the master fuse FS is cut off so that the first decoupling capacitor group 311 is isolated from the external input power line 270. The master fuse FS can be cut off at the wafer stage of a semiconductor device or after packaging a semiconductor device. If the master fuse FS needs to be cut at the semiconductor device wafer stage, it is preferable that the master fuse FS be cut using a laser. If the master fuse FS needs to be cut after packaging, it is preferable that the master fuse FS be cut using electricity.

Figure 5:
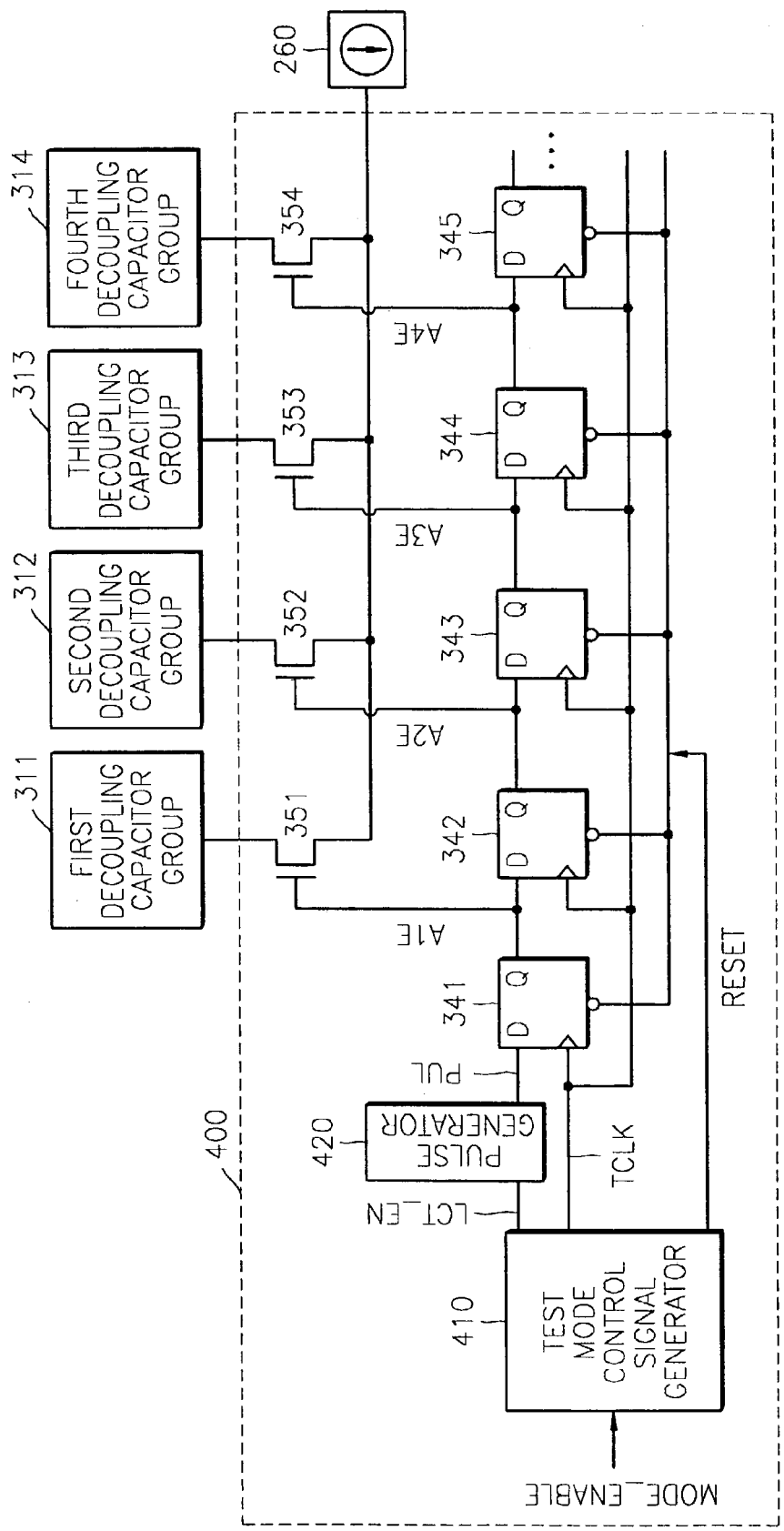
FIG. 5 is a circuit diagram of an embodiment of a testing unit included in the power noise removing circuit of FIG. 2.

FIG. 5 is a circuit diagram showing a testing unit 400 included in the power noise removing circuit 240 of FIG. 2. Referring to FIG. 5, the testing unit 400 includes a test mode control signal generator 410, a pulse generator 420, a plurality of test switches 351 through 354, and a plurality of test switch control signal generators (341 through 345). For convenience of explanation, the plurality of test switches are distinguished one from another by indicating first through fourth test switches 351 through 354 as shown in FIG. 5.

In response to a mode enable command MODE_EN-ABLE, the test mode control signal generator 410 activates a test enable signal LCT_EN and generates a test clock signal TCLK necessary for testing. The mode enable command MODE_ENABLE can be applied to the test mode control signal generator 410 using a test pad or a mode resister set. As described above, the test enable signal LCT_EN is enabled when entering into a mode for testing whether a decoupling capacitor group is defective.

The pulse generator 420 generates a pulse signal PUL whose level is kept high for a predetermined period of time in response to the activation of the test enable signal LCT_EN. Preferably, the high level period of the pulse signal PUL is shorter than one period of the test clock signal TCLK.

The test switch control signal generators 341 through 345 of FIG. 5 are implemented by flip-flops, and accordingly, are referred to as first through fifth flip-flops 341 through 345. The first through fifth flip-flops 341 through 345 are connected to one another in series in such a way that the output of the first flip-flop is connected to the input of the second flip-flop and the output of the second flip-flop is connected to the input of the third flip-flop, and so on. The test clock signal TCLK generated by the test mode control signal generator 410 is applied to a clock terminal of each of the first through fifth flip-flops 341 through 345. A reset signal RESET generated by the test mode control signal generator 410 is applied to a reset terminal of each of the first through fifth flip-flops 341 through 345.

The pulse signal PUL generated by the pulse generator 420 is applied to the input terminal D of the first flip-flop 341. The first flip-flop 341 outputs a first test switch control signal A1E to the first test switch 351 and simultaneously to the input terminal D of the second flip-flop 342. The outputs of the second through fourth flip-flops 342 through 344 are second through fourth test switch control signals A2E, A3E, and A4E, respectively.

The first through fourth test switches 351 through 354 are switched on or off in response to the test switch control signals A1E, A2E, A3E, and A4E, respectively.

As described above, a test switch and a flip-flop that generates a test switch control signal received by the test switch constitute a local testing unit shown in FIG. 3.

If the first test switch 351 is turned on in response to the first test switch control signal A1E, the first decoupling capacitor group 311 is connected to the monitoring pad 260. Then, a determination on whether the first decoupling capacitor group 311 is defective depends on measured current flowing through the monitoring pad 260.

If the second test switch 352 is turned on in response to the second test switch control signal A2E, the second decoupling capacitor group 312 is connected to the monitoring pad 260. If the third test switch 353 is turned on in response to the third test switch control signal A3E, the third decoupling capacitor group 313 is connected to the monitoring pad 260. If the fourth test switch 354 is turned on in response to the fourth test switch control signal A4E, the fourth decoupling capacitor group 314 is connected to the monitoring pad 260.

As described above, each of the decoupling capacitor groups 311 through 314 is connected to the monitoring pad 260, which determines whether each of the decoupling capacitor groups 311 through 314 is defective.

A test for determining whether each of the decoupling capacitor groups is defective can be performed in a wafer level testing step. If the amount of current flowing through the monitoring pad 260 is equal to or greater than a predetermined amount, a decoupling capacitor group of interest is determined to be defective. Then, the repair switch is turned off by cutting off the master fuse of the local repair circuit unit which controls a defective decoupling capacitor group. If the amount of current indicated on the monitoring pad 260 upon testing of the first decoupling capacitor group 311 is equal to or greater than the predetermined amount, the first repair switch 331 is turned off by cutting off the master fuse of the local repair circuit unit 320 of FIG. 3 which controls the first decoupling capacitor group 311. Consequently, the first decoupling capacitor group 311 is isolated from the external input power line 270 of FIG. 3.

In this manner, a decoupling capacitor group including a defective cell capacitor can be easily disconnected from an external input power line. If a defective decoupling capacitor group is disconnected from an external input power line, the defective decoupling capacitor group cannot perform its function, which prevents current leakage caused by the defective decoupling capacitor group.

On the other hand, if a decoupling capacitor group is not defective, the master fuse of a local repair circuit unit corresponding to the non-defective decoupling capacitor group is not cut off. Hence, the repair switch of the local repair circuit unit maintains its on state and connects the non-defective decoupling capacitor group to the external input power line.

Preferably, an existing pad used for purposes other than a monitoring pad is used as the monitoring pad 260 in order to prevent an increase in the area of the chip. In other words, the monitoring pad 260 can be an arbitrary pad that is used in an existing test performed in a wafer step. In some cases, a data input output pad or an address pad can be used as the monitoring pad 260.

Figure 6:
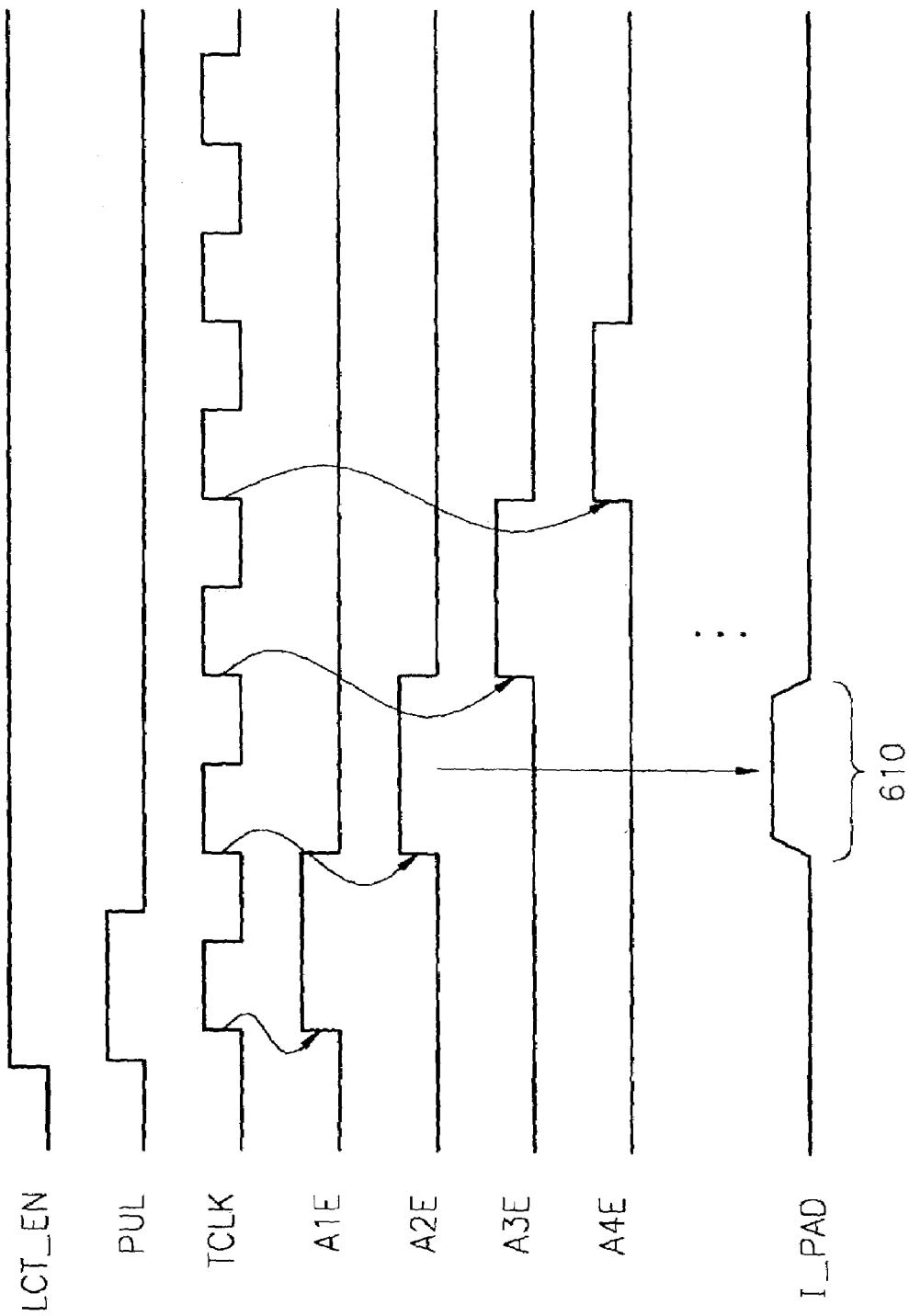
FIG. 6 is a timing diagram for explaining the testing unit of FIG. 5.

FIG. 6 is a timing diagram of signals in the testing unit 400 of FIG. 5. An example of a process of determining whether a decoupling capacitor group is defective will now be described with reference to FIGS. 5 and 6.

First, in order to enter into a test mode for determining whether a decoupling capacitor group is defective, a mode enable command MODE_ENABLE is applied to the test mode control signal generator 410. Then, the test mode control signal generator 410 activates a test enable signal LCT_EN and generates a test clock signal TCLK.

In response to the activation of the test enable signal LCT_EN, the pulse generator 420 generates a pulse signal PUL having a predetermined activation period.

The first through fifth flip-flops 341 through 345 transmit inputs D to outputs Q in response to a rising edge of the test clock signal TCLK. Accordingly, the first flip-flop 341 outputs a pulse signal PUL with a high level as the first test switch control signal A1E in response to the first rising edge of the test clock signal TCLK. Since the pulse signal PUL is in a low level at the second rising edge of the test clock signal TCLK, the high level of the first test switch control signal A1E changes to a low level in response to the second rising edge of the test clock signal TCLK. Hence, the first test switch control signal A1E maintains a high level for about one period from the first rising edge of the test clock signal TCLK and then enters into a low level.

Because the second flip-flop 342 receives the first test switch control signal A1E, the second flip-flop 342 outputs the second test switch control signal A2E, which is activated to a high level from the second rising edge of the test clock signal TCLK and enters into a low level about one period after the second rising edge.

In this way, the third flip-flop 343 generates the third test switch control signal A3E which maintains a high level for about one period after the third rising edge of the test clock signal TCLK. The fourth flip-flop 344 generates the fourth test switch control signal A4E which maintains a high level for about one period after the fourth rising edge of the test clock signal TCLK.

The test switches 351 through 354, which are controlled by the first through fourth test switch control signals A1E, A2E, A3E, and A4E, are turned on while their respective test switch signals remain in a high level and connect respective decoupling capacitor groups to the monitoring pad 260. A current measuring device is connected to the monitoring pad 260 in order to measure current flowing through the monitoring pad 260.

Reference numeral 610 of FIG. 6 indicates the fact that the amount of current I_PAD flowing through the monitoring pad 260 is 0 when the first, third, and fourth test switch control signals A1E, A3E, and A4E are in a high level, and is equal to or greater than a predetermined amount when the second test switch control signal A2E is in a high level. Accordingly, it can be determined that the second decoupling capacitor group 312 of FIG. 5 includes a defective decoupling capacitor. In this case, the second decoupling capacitor group 312 is disconnected from the external input power line 270 by cutting off the master fuse of a local repair circuit unit which controls the second decoupling capacitor group 312.

While the present invention has been particularly shown and described with reference to exemplary embodiments thereof, it will be understood by those of ordinary skill in the art that various changes in form and details may be made therein without departing from the spirit and scope of the present invention as defined by the following claims.

According to the present invention, power noise can be effectively removed using small high-capacity decoupling capacitors. Also, memory device reliability can be improved by testing whether the decoupling capacitors are defective and by stopping the operation of any defective decoupling capacitors.

What is claimed is:

1. A circuit for removing noise from an internal power line of a semiconductor memory device, the internal power line for supplying power to a memory cell array of the memory device, said circuit comprising:
   a plurality of decoupling capacitor groups which remove noise from the internal power line, each group including at least one DRAM cell type decoupling capacitor, each DRAM cell type decoupling capacitor having a first terminal coupled to the internal power line and a second terminal; and
   a repair circuit unit which selectively connects individual ones of the plurality of decoupling capacitor groups to an external input power line, wherein the second terminal of each DRAM cell type decoupling capacitor of each group connected to the external input power line is connected to the external input power line, and wherein the second terminal of each DRAM cell type decoupling capacitor of each group not connected to the external input power line is not connected to the external input power line.

2. The circuit of claim 1, further comprising:
   a monitoring pad which detects an amount of current leaking from the decoupling capacitor groups; and
   a testing unit which controls a connection of each of the decoupling capacitor groups to the monitoring pad.

3. The circuit of claim 2, wherein the repair circuit unit comprises:
   repair switches which are connected between each of the decoupling capacitor groups and the external input power line and which are opened and closed in response to repair switch control signals; and
   a repair switch control signal generator which generates the repair switch control signals.

4. The circuit of claim 3, wherein the repair switch control signal generator generates the repair switch control signals in response to the cutting of a master fuse.

5. The circuit of claim 2, wherein the testing unit comprises:
   test switches which are connected between each of the decoupling capacitor groups and the monitoring pad and which are opened or closed in response to test switch control signals; and
   a test switch control signal generator which generates the test switch control signals.

6. The circuit of claim 5, wherein the test switch control signal generator includes a plurality of serially-connected flip-flops which generate the test switch control signals in response to a test clock signal.

7. A circuit for removing noise from an internal power line of a semiconductor memory device, the internal power line for supplying power to a memory cell array of the memory device, said circuit comprising:
   a decoupling capacitor group which includes a plurality of decoupling capacitors, wherein noise flowing into the internal power line is stored in the decoupling capacitors when the decoupling capacitor group is enabled;
   a repair circuit unit which selectively enables or disables the decoupling capacitor group;
   a monitoring pad which measures an amount of current leaking from the decoupling capacitor group; and
   a testing unit which controls a connection of the decoupling capacitor group to the monitoring pad.

8. The circuit of claim 7, wherein each of the decoupling capacitors is a DRAM cell type capacitor having one terminal electrically coupled to the internal power line and another terminal electrically coupled to a storage node.

9. The circuit of claim 8, wherein the repair circuit unit comprises:
   a repair switch which is connected between the storage node and an external input power line and which is opened or closed in response to a repair switch control signal, wherein the decoupling capacitor group is enabled when the repair switch is closed and wherein the decoupling capacitor group is disabled when the repair switch is opened; and
   a repair switch control signal generator which generates the repair switch control signal.

10. The circuit of claim 9, wherein the repair switch control signal generator generates the repair switch control signal which opens the repair switch in response to the cutting of a master fuse.

11. The circuit of claim 9, wherein the repair switch control signal generator generates the repair switch control signal which opens the repair switch in response to a test enable signal.

12. The circuit of claim 8, wherein the testing unit comprises:
- a test switch which is connected between the storage node and the monitoring pad and which is opened or closed in response to a test switch control signal; and
- a test switch control signal generator which generates the test switch control signal.

13. A semiconductor memory device comprising:
- a memory cell array including a plurality of sub array blocks;
- an internal power line supplying power to the sub array blocks, the internal power line having in a mesh shaped configuration; and
- a power noise removing circuit comprising (a) a plurality of decoupling capacitor groups which remove noise from the internal power line, each group including at least one DRAM cell type decoupling capacitor having a first terminal coupled to the internal power line, and (b) a repair circuit unit which selectively connects individual ones of the plurality of decoupling capacitor groups to an external input power line, wherein the second terminal of each DRAM cell type decoupling capacitor of each group connected to the external input power line is connected to the external input power line, and wherein the second terminal of each DRAM cell type decoupling capacitor of each group not connected to the external input power line is not connected to the external input power line.

14. The semiconductor memory device of claim 13, wherein the power noise removing circuit further comprises:
- a monitoring pad which detects an amount of current leaking from the decoupling capacitor groups; and
- a testing unit which controls a connection of each of the decoupling capacitor groups to the monitoring pad.

15. A semiconductor memory device comprising:
- a memory cell array including a plurality of sub array blocks;
- an internal power line supplying power to the sub array blocks, the internal power line having in a mesh shaped configuration; and
- a power noise removing circuit comprising (a) a decoupling capacitor group which includes a plurality of decoupling capacitors, wherein noise flowing into the internal power line is stored in the decoupling capacitors when the decoupling capacitor group is enabled, (b) a repair circuit unit which selectively enables or disables the decoupling capacitor group, (c) a monitoring pad which measures an amount of current leaking from the decoupling capacitor group, and (d) a testing unit which controls a connection of the decoupling capacitor group to the monitoring pad.

16. The semiconductor memory device of claim 15, wherein each of the decoupling capacitors is a DRAM cell type capacitor having one terminal electrically coupled to the internal power line and another terminal electrically coupled to a storage node.

17. The semiconductor memory device of claim 16, wherein the repair circuit unit comprises:
- a repair switch which is connected between the storage node and an external input power line and which is opened or closed in response to a repair switch control signal, wherein the decoupling capacitor group is enabled when the repair switch is closed and wherein the decoupling capacitor group is disabled when the repair switch is opened; and
- a repair switch control signal generator which generates the repair switch control signal.

18. The semiconductor memory device of claim 17, wherein the repair switch control signal generator generates the repair switch control signal which opens the repair switch in response to the cutting of a master fuse.

19. The semiconductor memory device of claim 17, wherein the repair switch control signal generator generates the repair switch control signal which opens the repair switch in response to a test enable signal.

20. The semiconductor memory device of claim 16, wherein the testing unit comprises:
- a test switch which is connected between the storage node and the monitoring pad and which is opened or closed in response to a test switch control signal; and
- a test switch control signal generator which generates the test switch control signal.

* * * * *